(12) United States Patent
Wang et al.

(10) Patent No.: US 6,721,926 B2
(45) Date of Patent: Apr. 13, 2004

(54) METHOD AND APPARATUS FOR IMPROVING DIGITAL CIRCUIT DESIGN

(75) Inventors: Xinning Wang, Portland, OR (US); Prashant Sawkar, Portland, OR (US); Barbara Chappell, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 11 days.

(21) Appl. No.: 10/055,173

(22) Filed: Jan. 25, 2002

(65) Prior Publication Data

US 2003/0145288 A1 Jul. 31, 2003

(51) Int. Cl.[7] ............................................. G06F 17/50
(52) U.S. Cl. ................................ 716/2; 716/18; 716/12
(58) Field of Search ............................. 716/1, 2, 3, 4, 716/5, 6, 12, 13, 14, 15, 16, 17, 18

(56) References Cited

U.S. PATENT DOCUMENTS

| | | | | |
|---|---|---|---|---|
| 6,282,695 B1 | * | 8/2001 | Reddy et al. | 716/18 |
| 6,286,128 B1 | * | 9/2001 | Pileggi et al. | 716/18 |
| 6,336,208 B1 | * | 1/2002 | Mohan et al. | 716/16 |
| 6,460,166 B1 | * | 10/2002 | Reddy et al. | 716/2 |
| 6,470,486 B1 | * | 10/2002 | Knapp | 716/18 |
| 6,546,539 B1 | * | 4/2003 | Lu et al. | 716/12 |

* cited by examiner

Primary Examiner—Vuthe Siek
Assistant Examiner—Binh C. Tat
(74) Attorney, Agent, or Firm—Kenyon & Kenyon (57) ABSTRACT

A method and apparatus provide a digital circuit including dynamic logic that minimizes circuit-path delay, residue logic, and circuit area. The method and apparatus use a library of circuit cells to produce a digital circuit design using a mapping algorithm. The mapping algorithm firstly determines an arrangement of circuit cells to minimize the delay in the circuit design, secondly determines an arrangement of circuit cells to minimize the residue logic for the circuit design, thirdly determines an arrangement of circuit cells to minimize the circuit area for the circuit design, and then repeats the process for each node in the circuit until the best circuit design is produced in accordance with predetermined criteria.

24 Claims, 5 Drawing Sheets

C – CMOS gates
D – Domino gates

FIG. 5a     Resynthesis     FIG. 5b

METHOD AND APPARATUS FOR IMPROVING DIGITAL CIRCUIT DESIGN

BACKGROUND OF THE INVENTION

1. Field of the Invention

The present invention relates generally to a methodology for designing a digital logic circuit. It particularly relates to a method and apparatus for providing dynamic logic circuit synthesis techniques that generate an optimal digital circuit that minimizes critical-path delay, residue logic, and circuit area.

2. Background

Dynamic logic circuit families (e.g., domino logic) have long been employed in high performance microprocessors and other commercially important semiconductor products as a solution for logic blocks needing more speed and functionality than found with standard CMOS circuits. "Domino logic" refers to a circuit arrangement in which there are several series coupled logic stages having pre-charged output nodes (the stages may be referred to as a "domino block"). The output node of each logic stage is precharged to a first logic level during a "precharge phase". During an "evaluation phase", one or more signals may be applied to the first stage of the domino block. Depending upon the input signals, the output node may transition to a second logic level it "evaluates". As each domino stage in the chain evaluates, the output of the next domino stage may be enabled to switch. Since the precharged nodes "fall" in sequence, the operation has been analogized to falling dominoes, and hence the name for this type of circuit arrangement.

An advantage of dynamic logic is the capability to supply much more dense functionality in a given time period while providing higher drive capability than is possible with standard static CMOS logic. Dynamic logic gates are pre-charged and selectively discharged through a n-device logic tree at every stage or every other stage. They do not require a p-logic tree as in standard push-pull static CMOS and, therefore, the capacitive loads on both the inputs and the outputs can be much smaller. Additionally, transition times and switching speeds can be faster by avoiding use of series-connected p-gates in the critical switching path on the n-logic stages and due to smaller contention currents. Therefore, the logic function can be much wider (accepting any number of inputs—e.g. four or more). Especially in highly scaled technologies, NOR and NAND-NOR logic with greater than (>) 4 inputs to a gate is not viable in static gates. It can have high speed and reasonable drive capability in dynamic gates. The major disadvantages of dynamic logic are the larger design complexity and expertise that are required for effective operation as well as the higher power and larger, higher cost circuit area that is needed, especially if the dynamic circuitry is not well deployed and well designed.

Custom, expert, manual design has been necessary to use dynamic circuits effectively and safely as solutions to critical, complex logic on microprocessors. Although dynamic logic design can have an important impact on chip (processor) performance, it may cost a disproportionate share of effort and risk, even though used on a small percentage of the processor. An automated or semi-automated synthesis system for domino logic would greatly improve design productivity and chip convergence.

Logic synthesis is a key factor in using dynamic logic to its best advantage and for minimizing its costs and risks. Typically, logic synthesis process can be divided into a technology independent optimization phase and a technology mapping phase. The technology independent optimization phase performs logic minimization and structuring in order to find a good multilevel structure for mapping to an ECAD (electronic computer-aided design) domino library.

Technology mapping is the process of implementing a Boolean network using gates from a technology library. The goal is to produce a circuit with minimal critical-path delay and area via optimal use of gates in the library. Traditional technology mapping techniques developed both by EDA vendors and universities have been primarily targeted at standard static CMOS circuits and are not well-suited for domino logic. They are generally targeted at logic blocks with less critical requirements than those needing dynamic circuitry and at users with less high speed circuit design experience than the dynamic logic designer. These mapping techniques have several disadvantages for application to high-speed dynamic circuitry including: 1) the use of pattern generation and graph representation of logic functions, that result in pattern explosion (exponential growth in complexity for wide gates), 2) lack of support for dynamic design styles and configurations, 3) lack of support for monotonic logic networks (required for dynamic logic structures do to its precharge) or control over inversion placement, and 4) initially de-compose networks using only simple gates such as 2-input NAND (or 2-input NOR). Therefore, there is a need to provide a technology mapping solution that effectively synthesizes an optimal digital logic (e.g., domino logic) circuit having wider gate inputs and improvements in circuit delay.

DETAILED DESCRIPTION

The present invention includes a technology mapping algorithm for dynamic (e.g., domino) logic circuits that implements a Boolean network from a plurality of circuit cells selected from a domino library of circuit cells. The algorithm performs a "best circuit" approach to digital circuit design where a circuit design with minimal logic depth (critical-path delay) is first generated, then this first design is modified to generate a second design with minimal residue logic (minimum left-over logic flowing into subsequent logic stages) circuit area, and then this second design is modified to generate a circuit design with minimal circuit area. This algorithm is repeated until a final circuit design is generated that is in accordance with pre-determined criteria (e.g., path delay, circuit area, cost, speed, etc.).

The technical advantage of this invention is that the present invention enables the generation of a digital circuit design, including dynamic logic, that may support a greater number of inputs while still maintaining optimal delay, speed, and circuit area parameters. In accordance with embodiments of the present invention, the process described herein arranges an original circuit design into a combination of wide AND and OR gates (nodes), then a mapping algorithm is applied that synthesizes (implements) logic functions of the circuit design using circuit cells from a library of circuit cells representing domino and static logic gates, and then re-synthesizing is applied to the circuit design to optimize particular circuit design parameters (e.g., path delay, residue logic, circuit area, cost, speed, etc.).

Figure 1:
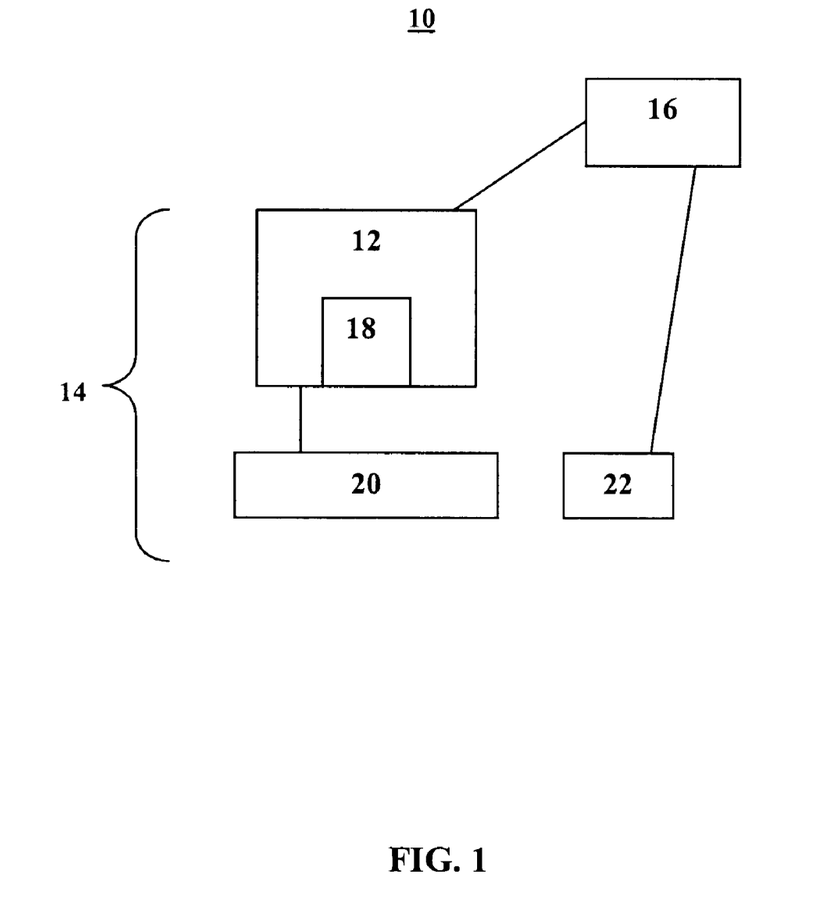
FIG. 1 illustrates an exemplary computer system in accordance with embodiments of the present invention

FIG. 1 illustrates an exemplary computer system 10 that may be advantageously used with embodiments of the present invention. As illustrated, computer system 10 may include a workstation 16 to which one or more nodes 14 may be connected. Workstation 16 may include a high-performance processor system such as an Intel Pentium III® processor. Workstation 16 may further include nonvolatile and volatile internal memory for storing software applications including an ECAD (electronic computer-aided design) system, which can be used to develop an integrated, digital circuit design in accordance with embodiments of the present invention. As shown in FIG. 1, each node 14 includes a display device 12, keyboard 20, and mouse 22. ECAD software applications executing within workstation 16 may display a graphic user interface (GUI) within display screen 18 of display device 12. A digital circuit designer may interact with the GUI on display screen 18 using keyboard 20 and mouse 20 to help develop a digital circuit design in accordance with embodiments of the present invention.

Figure 2:
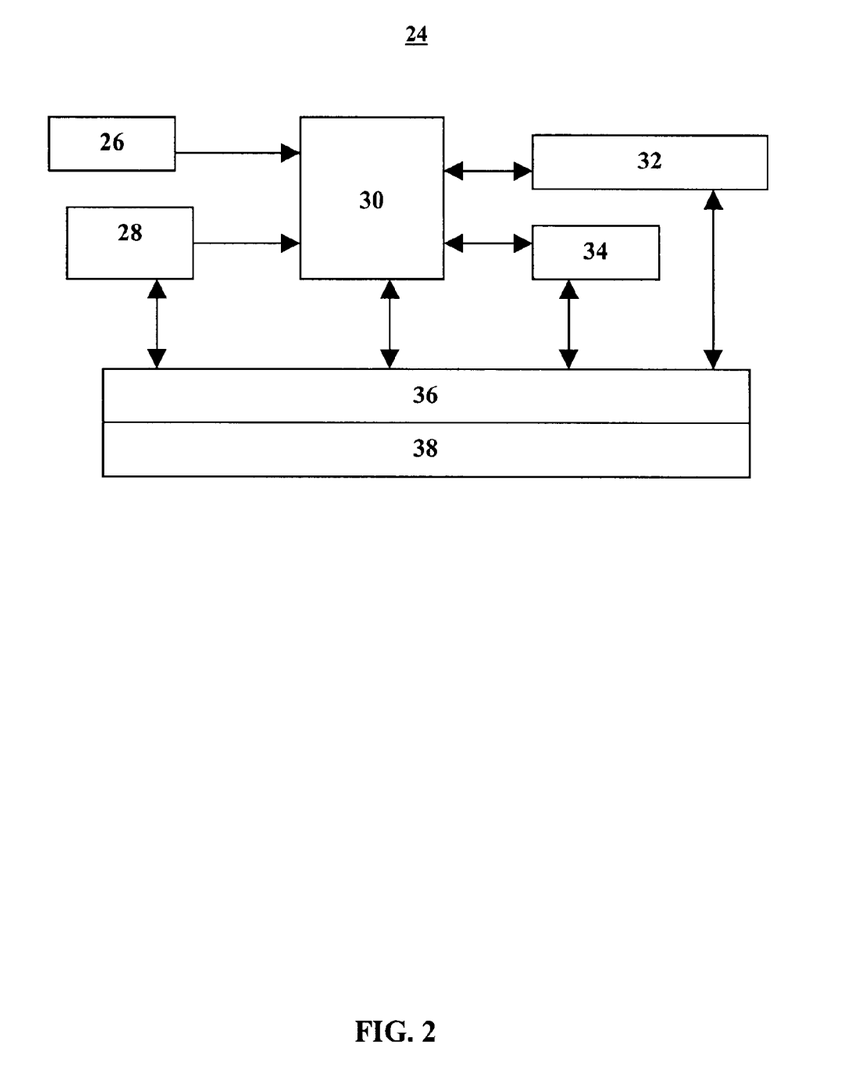
FIG. 2 illustrates an exemplary software architecture for the computer system in accordance with embodiments of the present invention.

FIG. 2 illustrates an exemplary software architecture 24 for the computer system 10 in accordance with embodiments of the present invention. The software architecture 24 may include an operating system 38, which provides a background computing environment and controls the allocation of the resources of the computer system 10 to the ECAD system including HDL (hardware description language) editor 28, logic synthesizer 30, time synthesizer 32, and layout synthesizer 34. Furthermore, operating system 38 provides a number of system services which are accessible to software applications (modules) 28, 30, 32, and 34 via an Application Programming Interface (API) 36.

HDL editor 28 provides facilities (e.g., a schematic editor) that permit a digital circuit designer to compose an RTL (Register Transfer Level) description language logical definition of a digital circuit design. In addition to the inputs, logical functions, and outputs to be included within the digital circuit, the logic description developed using HDL editor 28 may include timing constraints (requirements) for the digital circuit design.

In accordance with embodiments of the present invention, the logic synthesizer 30 may be used by a digital circuit designer to automatically synthesize a gate-level circuit design from a logical description. Logic synthesizer 30 may receive (input) an RTL description of a digital circuit design (e.g., from HDL editor 28), along with timing constraints, and output (generate) an optimal gate-level netlist. Logic synthesizer 30 may then take the netlist as an input and translate the netlist into a physical layout of a Boolean network using layout synthesizer 34. Logic synthesizer 30 may further, in response to a RTL description of a logical function (e.g., NAND, NOR, inverter, etc.), access a circuit cell within cell library 26 that implements the logical function. In accordance with embodiments of the present invention, cell library 26 may include circuit cells using different transistor topologies including, but not limited to, static logic, domino logic, delayed reset domino logic, footed/non-footed domino logic, pseudo-clocked logic, and non-inverting preset logic. Additionally, cell library 26 may store the timing constraints for each of the circuit cells that may be accessed or generated by logic synthesizer 30. Time synthesizer 32 may be used to verify the transistor components of the digital circuit design.

In accordance with embodiments of the present invention, the digital circuit design, implemented using circuit cells selected from the cell library 26, may have an interleaving mixture of domino and static logic circuits where domino NAND gates and static CMOS gates are always followed by each other. Each circuit cell in the library is represented by a particular logic function (e.g., NAND, NOR, inverter, etc.), and groups of circuit cells may be represented by a logic block. Furthermore, the library of circuit cells is a pre-qualified and pre-characterized library including cells representing wide logic functions including wide AND, wide NOR, and wide OR logic functions (allowing any number of inputs) where structural bias is not needed. Advantageously, in accordance with embodiments of the present invention, the mapping algorithm may be targeted for logic functions allowing at least 4 inputs and may have a linear (as opposed to an exponential) complexity of O(N) where N is the number of nodes in the network. Each node in the network is traversed only once during mapping.

Furthermore, the cell library 26 may use strings to represent particular logic functions (and circuit cells) where each cell in the library and the function implemented by each node in the network may be represented using strings. The string representation may be used to implement a subnetwork of nodes in the Boolean network. For example, the function of a NAND4 (4-input NAND game) domino gate may be represented as "s*s*s*s" and the function of a NAND2 static CMOS gate may be represented as "s*s". Since a dual function may be used for the static CMOS gate, and the domino and static logic gates are always interleaved, all the inversions are removed from the string representations making the composition of functions for internal nodes in the monotonic network straightforward.

In accordance with embodiments of the present invention, to synthesize the circuit design (representing a Boolean network) from monotonic (no inversion) domino logic in accordance with the mapping algorithm, a fully dual-rail network must initially be generated. Firstly, for each output, each output value and its complement is determined. Secondly, all inverters are pushed to the inputs to virtually eliminate all inverters from the internal nodes of the circuit design. Thereafter, the dual-rail network is inverter-free and includes both polarities of each output assuming both polarities for each input are available. For internal nodes, one or both polarities exist depending on whether they are needed for any output polarity. Subsequently, the mapping algorithm and resynthesis may be performed on the circuit design. Furthermore, different design styles for circuit cells may be chosen (e.g., via HDL editor 28 by a designer) to generate a circuit design including a mixture of static and domino cells where the domino cells support dual-plurality inputs/outputs.

In accordance with embodiments of the present invention, a digital circuit designer, using HDL editor 28 of the ECAD system 24, may pre-decompose a boolean network into only AND and OR nodes (including wide input nodes) using selected width and timing constraints inputs. From this pre-decomposition of the Boolean network, the mapping algorithm may be performed to generate an optical digital circuit design.

Figure 3:
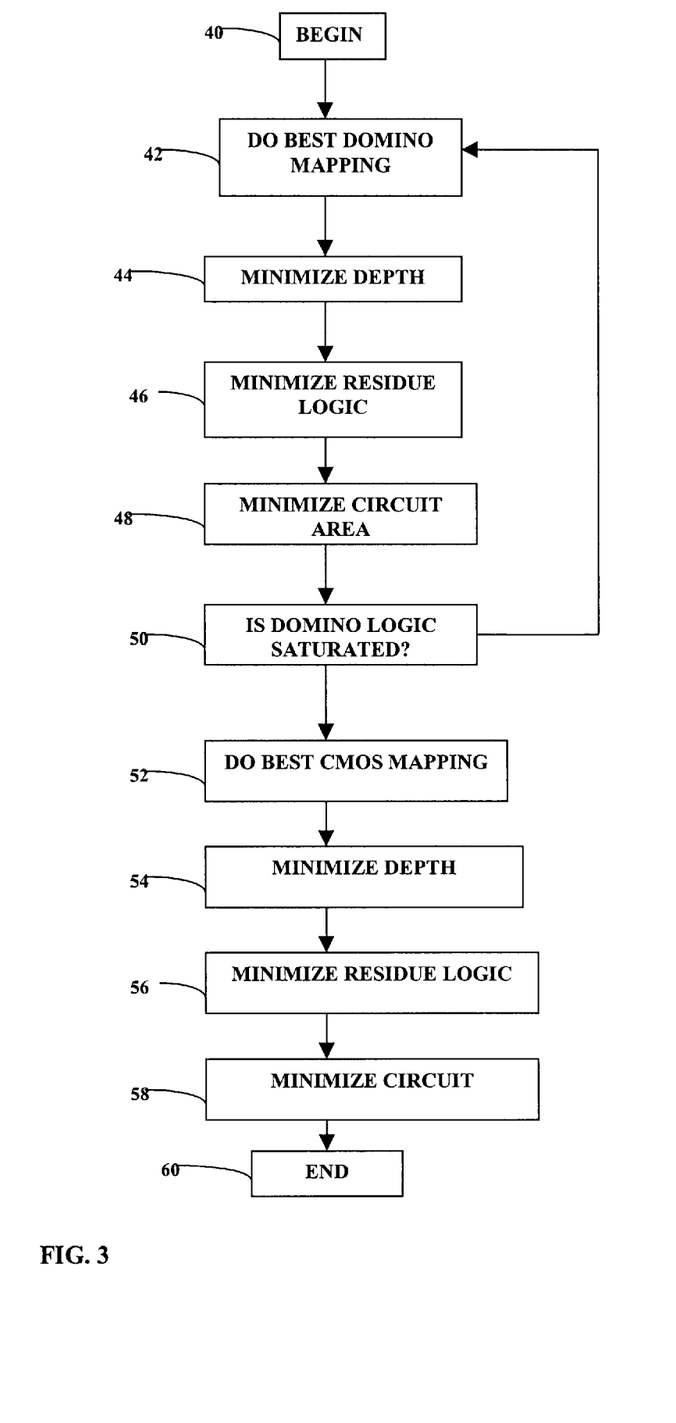
FIG. 3 illustrates an exemplary flowchart of a domino logic mapping algorithm in accordance with embodiments of the present invention.

FIG. 3 illustrates an exemplary flowchart of a domino logic mapping algorithm used for a pre-decomposed Boolean network in accordance with embodiments of the present invention. This algorithm (process) may be used by a digital circuit designer to develop a digital circuit design with optimal circuit parameters using the ECAD software architecture 24 in FIG. 2. The algorithm proceeds in an input-to-output topological order (starting at a first logic level) to construct the "best node" by sorting the inputs (fanins) for each node according to logic level in the digital circuit design. The algorithm enumerates all possible associative decompositions of the inputs for each node.

As shown, the algorithm begins at block 40, and thereafter proceeds to block 42 where domino mapping of each node (or logic level) in the circuit design is initiated by logic synthesizer 30 processing a netlist that may be generated from an RTL description of a logic function using HDL editor 28. Proceeding to block 44, circuit depth (critical-path delay) is minimized. To minimize delay, the number of logic levels within the node are reduced. Logic synthesizer 30 then selects one or more circuit cells from cell library 26 to satisfy this requirement and implement the particular logic function. Proceeding to block 46, residue logic is minimized. Residue logic is defined as the amount (complexity) of logic that flows into subsequent logic levels. To minimize residue logic, the complexity of the Boolean expressions leading to subsequent logic levels is reduced. To implement this requirement, the number of literals for each boolean expression (leading to a subsequent logic level) are determined and the mapping with the lowest number of literals is selected. Logic synthesizer 30 then selects one or more circuit cells from cell library 26 to satisfy this requirement and implement the particular logic function.

Proceeding to block 48, circuit area is minimized. To minimize circuit (cell) area, the number of the number of logic gates for that logic level are reduced. Logic synthesizer 30 then selects one or more circuit cells from cell library 26 to satisfy this requirement and implement the particular logic function.

Proceeding to block 50, a query of whether domino mapping has reached saturation (fully populated with a complete set of domino logic) at the logic level is performed. If not saturated, domino mapping is repeated at block 42 by logic synthesizer 30 by packing in more logical functions implemented in domino logic with circuit cells from library 26. If saturated, static logic circuit (e.g., CMOS) mapping is initiated following similar steps 52, 54, 56, to minimize circuit depth, residue logic, and circuit area. Proceeding to block 60, the algorithm terminates.

In accordance with embodiments of the present invention, any programming language (e.g., C++), compatible with ECAD software architecture 24, may be selected for implementing the algorithm. Exemplary program code for the logic mapping algorithm of FIG. 3, including program code for domino mapping and static mapping, is presented herein:

```
Algorithm min-depth_tech_mapping (network, lib, mapping_template)
For each node v visited in topological order {
loop: {
/* sort fanins according to their logic level and determine the level to start mapping */
        fanins = levelize(v->fanins);
        mapping_level = determine_mapping_level(fanins);
        /* First, do domino mapping */
        /*find best domino mapping for v involving fanins at mapping_level or below by enumerate all possible
        associative decomposition of those fanins */
        /* best mapping is defined as the one with minimal depth increase, minimal fanin for residue logic, and
        minimal gate count increase */
        array_of_mapped_domino_nodes = best_domino_mapping(v, mapping_level, mapping_template);
        /* Second, do static cmos mapping */
        if (len(array_of_mapped_domino_nodes)>1) {
        /* Do cmos mapping only if mapping of domino stage is saturated. Otherwise, packing more functions
        in domino stage. */
        array_of_mapped_nodes = best_cmos_mapping(array_of_mapped_domino_nodes);
        } else {
        array_of_mapped_nodes = array_of_mapped_domino_nodes;
        }
        /* Third, update the network with the mapping informafion */
        update_network(network, v, array_of_mapped_nodes);
        if(!done_mapping(v)) go to loop
        }
        end min-depth_tech_mapping
```

Although FIGS. 4a–5b illustrate various views of the present invention, these figures are not meant to portray digital circuit design elements in precise detail. Rather, these figures illustrate digital circuit design elements in a manner to more clearly convey the concepts of the present invention.

Figures 4A, 4B, 4C, 4D:
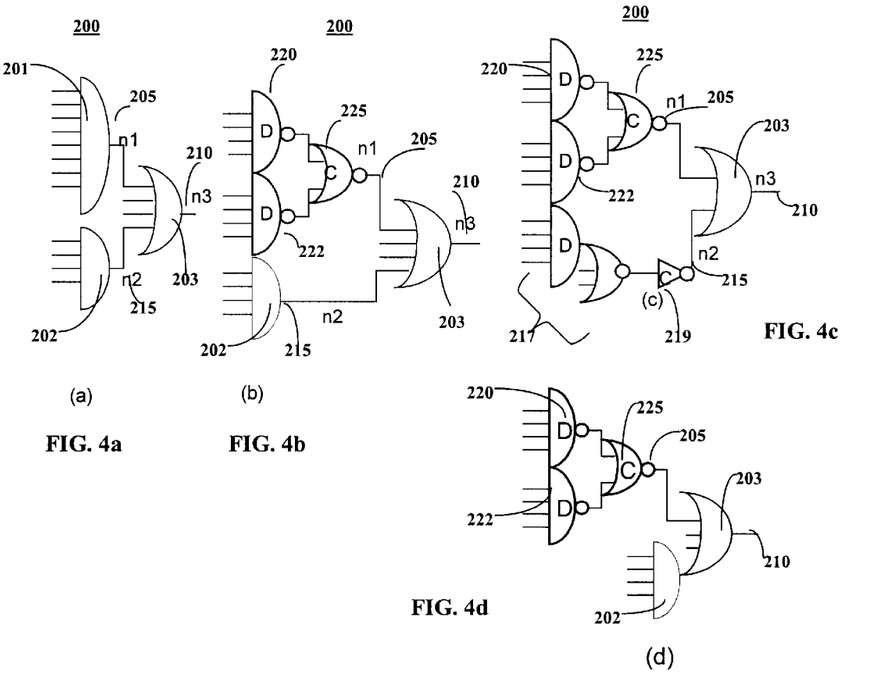
FIGS. 4a–4d illustrate exemplary domino logic mapping in accordance with an embodiment of the present invention.

FIGS. 4a–4d illustrate exemplary domino logic mapping in a digital circuit design in accordance with embodiments of the present invention. As shown in FIG. 4a, a boolean network 200 in a digital circuit design may be pre-decomposed (initially be implemented) as AND gates (nodes) 201, 202 and OR gate (node) 203 with outputs 205, 210, 215 respectively, wherein outputs 205, 210 converge with two other inputs at OR node 203 to produce output 215. All inputs for nodes 201, 202, 203 are at level 0.

Thereafter, at each level of logic for each node 201, 202, 203, a subset of library cells is determined according to the mapping algorithm of FIG. 3 and individual designer overrides. Exemplary designer overrides may include phase-constraints where for the given (monotonic) network 200 shown in FIG. 4a, the user (designer) may specify constraints for where inverters should be placed (e.g., either at the inputs or outputs of domino logic circuit levels). This subset of library cells may be used as a candidate cell library for mapping at that level. When mapping each node 201, 202, 203, string matching is performed relative to every cell in the candidate library to identify all possible matches and the residue logic in each case, which may overflow the functionality of each cell.

As shown in FIG. 4*b*, node 201, representing an AND logic function, may be synthesized (implemented) in response to mapping by logic synthesizer 30 performing the algorithm of FIG. 3. The mapping result of this particular logic function may be a combination of domino logic gates (NAND4) 220, 222 and static CMOS logic gate (NOR) 225 from the cell library 26 to produce output 205. This mapping of domino logic gates 220, 222 and static CMOS logic gate 225, as selected from the cell library 26, minimizes the delay and residue logic (with a minimal number of gates) to produce the output 205. Advantageously, the reduction of residue logic for the circuit design may particularly reduce the residue logic for the static gates used in the design. Also, for this example, nodes 202, 203 may remain unmapped during this step as shown in FIG. 4*b*.

As shown in FIG. 4*c*, node 202 may be synthesized by logic synthesizer 30, performing the algorithm of FIG. 3, as a two-circuit domino complex logic gate 217 and static CMOS logic gate (inverter) 219 to produce output 215. Node 203 remains unmapped as shown in FIG. 4*c*. Using this mapping algorithm, output 215 may be produced from only 2 inputs (having been reduced from 4 inputs) which minimizes the delay and residue logic (with a minimal number of gates) producing output 215. In contrast, as shown in FIG. 4*d*, if mapping stops with node 201, then four inputs are still required at node 203 to produce output 215 creating a more complex boolean expression that increases the residue logic.

After the mapping algorithm synthesizes the boolean network (from the library 26) for the first level of nodes, the process of FIG. 3 may be repeated where the next level of nodes is found, the candidate library is reformed, and again the mapping algorithm finds the "best node" for this next level of nodes.

For the exemplary mapping shown in FIG. 4*c*, a representative string for nodes 220 and 222 may be s*s*s*s, and s*s for node 225 to indicate a NAND4 domino gate followed by a NOR2 static CMOS gate as shown in FIG. 4*c*. In accordance with embodiments of the present invention, functional string expressions for domino and static gates are composed separately, and this string matching procedure improves the efficiency of the mapping algorithm and enables exhaustive search of the cell library. Since the network follows an interleaving domino gate followed by a static gate pattern, the NAND function of gates 220, 222 may be written as s*s*s*s without a bar (inversion indicator) since the following static CMOS NOR gate will reverse the previous inversion by the domino NAND gate. Similarly, the NOR function of gate 225 may be written as s*s since it performs the equivalent of the AND function for this interleaving network since it is always receiving domino gate inputs that have been inverted.

In accordance with embodiments of the present invention, it is noted that circuit depth, residue logic, and circuit area may be weighted differently in determining the best circuit design to reduce fabrication costs (as related to pre-determined cost functions). For example, when circuit depth and residue logic are substantially equivalent, gate cost (as related to circuit area) may be calculated by a gate count (e.g., number of gates) that is weighted according to predetermined cost parameters in the circuit cell library (e.g., AND gates being a more expensive residue than OR gates) and pre-determined cost parameters on the nodes such as the number of inputs and outputs (fanins and fanouts). Cost functions may also be overridden by designer inputs. Furthermore, gate cost functions, mapping templates, and the candidate library may be functions of the mapping result of the previous level.

As shown in the previous example for FIGS. 4*a*–4*d*, the mapping algorithm of FIG. 3 prioritizes minimization of delay (e.g., high-speed) and residue logic (e.g., gates with high functionality) leaving circuit area reduction as a secondary consideration. Therefore, performance of the mapping algorithm of FIG. 3 may result in more complex gates being used than what was actually required to fulfil pre-determined parameters (e.g., high-speed). Cost-recovery resynthesis is therefore needed to reduce the cost of a high-speed (e.g., minimal delay) solution.

During the resynthesis process, the initially mapped domino logic network (using the algorithm of FIG. 3) is re-mapped to better improve the topology of the network. Optimally, the resynthesis process reduces circuit area without increasing logic depth (e.g., delay) to make the Boolean network less complex (reducing the cost). This re-mapping algorithm considers local clusters of multi-stage depth and reduces circuit area by propagating logic forward (e.g., toward a primary output). Again, efficient string matching and full enumeration are used to help find the optimum solution on a particular local cluster. The clustering size may be under designer control where the default is two levels of domino gates, or the designer may invoke additional or different cost functions for the re-mapping.

After the initial mapping, particular logic circuitry (e.g., transistors) may be sized and logic elements may be replicated to generate sufficient drive capability for each internal node. Resynthesis reduces the potential area increase due to subsequent power-up and logic replication. For example, particular circuit cells may have weak drive capability (weak at driving a long-wire input) such as a NOR2 gate and therefore may be replaced with circuit cells having a better drive capability such as NAND2 and INV high-skew static CMOS gates. Therefore, at least one purpose of resynthesis may be to reduce the number of NOR2 high-skew static CMOS gates to reduce final circuit area cost.

Figure 5A:
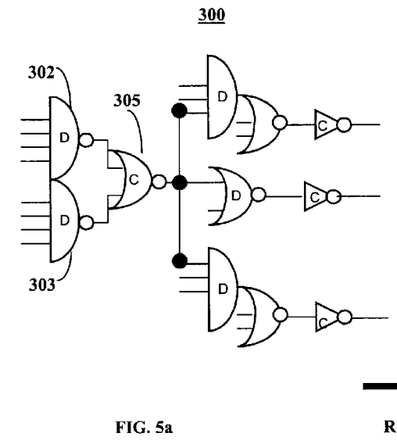
FIGS. 5a–5b illustrate exemplary domino logic mapping with resynthesis in accordance with an embodiment of the present invention.
Figure 5B:
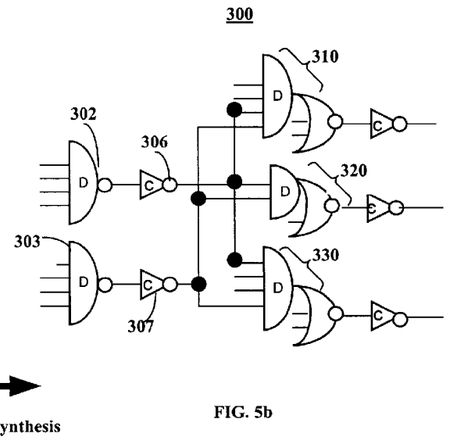

FIGS. 5*a*–5*b* illustrate an exemplary domino logic mapping with resynthesis. As shown in FIG. 5*a*, boolean network 300, synthesized from a plurality of cells selectively chosen from cell library 26 by logic synthesizer 30, is initially mapped to minimize logic depth (e.g., delay) and therefore uses at least one static CMOS NOR2 gate 305 that follows domino logic 302, 303. Following resynthesis, as shown in FIG. 5*b*, the function implemented by NOR2 gate 305 is redistributed to subsequent domino gate stages 310, 320, 330 that improves drive capability (and reduces final circuit area cost) without increasing the logic depth of network 300. Furthermore, the one 2-high cluster 302, 303, 305 (2 domino gates feeding to 1 CMOS gate) is replaced with two 1-high clusters 302, 306 and 303, 307, (1 domino gate feeding to 1 CMOS gate) that helps reduce the routing area due to improved routing flexibility. Thereafter, as shown in FIG. 5*b*, the finalized network 300, developed using the mapping algorithm of FIG. 3 and the resynthesis process as described herein, may be fabricated.

Additionally, in accordance with embodiments of the present invention, advanced design styles, as chosen from the cell library, may be supported by the mapping algorithm to generate an all-domino logic circuitry or a combination of domino and static logic circuitry for different timing requirements. The different design styles may include, but are not limited to, footed domino, footed/non-footed domino, and other types of domino gates. These different design styles may be defined by a template or by designer overrides of a default template. Furthermore, different logical level rules may be defined by a template or chosen by the designer such as every domino gate being followed by a CMOS gate with fanout (output generated) of only one of the domino gate and the CMOS gate to achieve correct-by-construction noise margin.

In accordance with embodiments of the present invention, several advantages are produced from the mapping algorithm described herein for generating a digital circuit design. A "best mapping' of each node in a Boolean network may be constructed by enumerating all possible associative decomposition of the node. Node fanins may be levelized and fanins at lower logic levels (e.g., early arriving fanins) may be mapped first which reduces final logic depth. The mapping algorithm has an O(N) runtime where N is the number of nodes in the network, and is able to generate a boolean network using domino logic where the domino logic gates may accommodate greater than large fan-in (e.g., 8–12 inputs).

In accordance with embodiments of the present invention, after the mapping algorithm and resynthesis have been performed, well-known processes in the art may be applied to the modeled Boolean network to obtain an optimum single-rail mapped network that minimizes the use of dual-rail logic without decreasing the speed of the network.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method for designing a digital logic circuit, comprising:
    providing a library of circuit cells;
    determining a first arrangement of circuit cells for a digital circuit design to minimize the an amount of delay in the circuit design, the design including dynamic logic circuits to perform a plurality of logic functions;
    converting the first arrangement of circuit cells into a second arrangement of circuit cells to minimize an amount of logic circuits connecting one logic stage of the circuit design to another logic stage; and
    converting the second arrangement of circuit cells into a third arrangement of circuit cells to minimize the circuit area for the circuit design.

2. The method of claim 1, wherein determining and converting include determining and converting said arrangements of circuit cells using circuit cells with more than four inputs.

3. The method of claim 1, wherein determining and converting include determining and converting said arrangements of circuit cells using circuit cells to perform one of wide AND and wide OR logic functions.

4. The method of claim 1, wherein providing includes providing a library of circuit cells, each cell being matched to a particular logic function using a string.

5. The method of claim 1, wherein determining and converting include determining and converting said arrangements of circuit cells where said arrangements of circuit cells include a mixture of cells to perform static logic and dynamic logic functions.

6. The method of claim 1, wherein determining and converting include determining and converting said arrangements of circuit cells to produce a circuit design including monotonic dynamic logic circuits having outputs of positive or negative polarity.

7. The method of claim 1, further comprising:
    converting the third arrangement into a fourth arrangement of circuit cells to recover at least a portion of the circuit area to enhance a pre-determined circuit parameter for the fourth arrangement of circuit cells.

8. The method of claim 7, wherein converting includes converting the third arrangement of circuit cells into a fourth arrangement of circuit cells to recover at least a portion of the circuit area to enhance the drive capability for the fourth arrangement of circuit cells.

9. A system for designing a digital logic circuit, comprising:
    a processing unit;
    a memory, coupled to said processing unit, to store a computer program;
    wherein said computer program being executable by said processing unit to:
        determine a first arrangement of circuit cells, from a library of circuit cells, for a digital circuit design to minimize an amount of delay in the circuit design, the design including dynamic logic circuits to perform a plurality of logic functions;
        convert the first arrangement of circuit into a second arrangement of circuit cells to minimize an amount of logic circuits connecting one logic stage of the circuit design to another logic stage; and
        convert the second arrangement of circuit cells into a third arrangement of circuit cells to minimize circuit area used for the circuit design.

10. The system of claim 9, wherein said computer program being executable by said processing unit to determine and to convert said arrangements of circuit cells using circuit cells with more than four inputs.

11. The system of claim 10, wherein said computer program being executable by said processing unit to determine and to convert said arrangements of circuit cells using circuit cells to perform one of wide AND and wide OR logic functions.

12. The system of claim 9, wherein said computer program being executable by said processing unit to determine and to convert said arrangements of circuit cells from the library of circuit cells, each cell being matched to a particular logic function using a string.

13. The system of claim 9, wherein said computer program being executable by said processing unit to determine and to convert said arrangements of circuit cells where the arrangements of circuit cells include a mixture of static cells and dynamic cells.

14. The system of claim 9, wherein said computer program being executable by said processing unit to determine and to convert said arrangements of circuit cells to produce a circuit design including monotonic dynamic logic circuits having outputs of positive or negative polarity.

15. The system of claim 9, wherein said computer program being executable by said processing unit to convert the third arrangement of circuit cells into a fourth arrangement of circuit cells to recover at least a portion of the circuit area to enhance a pre-determined circuit parameter for the fourth arrangement of circuit cells.

16. The system of claim 15, wherein said computer program being executable by said processing unit to convert the third arrangement into a fourth arrangement of circuit cells to recover at least a portion of the circuit area to enhance the drive capability for the fourth arrangement of circuit cells.

17. A machine-readable medium having stored thereon a plurality of executable instructions, the plurality of instructions comprising instructions to:

determine a first arrangement of circuit cells, from a library of circuit cells, for a digital circuit design to minimize an amount of delay in the circuit design, the design including dynamic logic circuits for performing a plurality of logic functions;

convert the first arrangement of circuit cells into a second arrangement of circuit cells to minimize an amount of logic circuits connecting one logic stage of the circuit design to another logic stage; and convert the second arrangement of circuit cells into a third arrangement of circuit cells to minimize circuit area used for the circuit design.

18. The medium of claim 17, wherein said instructions to determine and to convert include instructions to determine and to convert said arrangements of circuit cells using circuit cells with more than four inputs.

19. The medium of claim 17, wherein said instructions to determine and to convert include instructions to determine and to convert said arrangements of circuit cells using circuit cells to perform one of wide AND and wide OR logic functions.

20. The medium of claim 17, wherein said instructions to determine and to convert include instructions to determine and to convert said arrangements of circuit cells from the library of circuit cells, each cell being matched to a particular logic function using a string.

21. The medium of claim 17, wherein said instructions to determine and to convert include instructions to determine and to convert said arrangements of circuit cells where the arrangements of circuit cells include a mixture of static cells and dynamic cells.

22. The medium of claim 17, wherein said instructions to determine and to convert include instructions to determine and to convert said arrangements of circuit cells to produce a circuit design including monotonic dynamic logic circuits having outputs of positive or negative polarity.

23. The medium of claim 17, wherein said instructions to convert include instructions to convert the third arrangement of circuit cells into a fourth arrangement of circuit cells to recover at least a portion of the circuit area to enhance a pre-determined circuit parameter for the fourth arrangement of circuit cells.

24. The medium of claim 23, wherein said instructions to convert include instructions to convert the third arrangement of circuit cells into a fourth arrangement of circuit cells to recover at least a portion of the circuit area to enhance the drive capability for the fourth arrangement of circuit cells.

* * * * *

UNITED STATES PATENT AND TRADEMARK OFFICE
CERTIFICATE OF CORRECTION

PATENT NO. : 6,721,926 B2
DATED : April 13, 2004
INVENTOR(S) : Xinning Wang et al.

It is certified that error appears in the above-identified patent and that said Letters Patent is hereby corrected as shown below:

Column 9,
Line 44, "the an amount of" should be -- an amount of --.

Signed and Sealed this

Fifteenth Day of November, 2005

JON W. DUDAS
*Director of the United States Patent and Trademark Office*